United States Patent
Suda et al.

(10) Patent No.: US 7,227,788 B2
(45) Date of Patent: *Jun. 5, 2007

(54) MEMORY MANAGEMENT DEVICE AND MEMORY DEVICE

(75) Inventors: Takaya Suda, Kamakura (JP); Hiroaki Muraoka, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/408,021

(22) Filed: Apr. 21, 2006

(65) Prior Publication Data

US 2006/0187738 A1   Aug. 24, 2006

Related U.S. Application Data

(63) Continuation of application No. 11/022,857, filed on Dec. 28, 2004, now Pat. No. 7,057,942.

(30) Foreign Application Priority Data

Sep. 13, 2004  (JP) .............................. 2004-265806

(51) Int. Cl.
*G11C 8/00* (2006.01)
(52) U.S. Cl. ........................... 365/189.01; 365/185.03; 365/230.03
(58) Field of Classification Search ........... 365/189.01, 365/185.03, 230.03
See application file for complete search history.

(56) References Cited

U.S. PATENT DOCUMENTS 6,859,856 B2 * 2/2005 Piau et al. ................. 711/103

| | | | |
|---|---|---|---|
| 7,057,942 B2 * | 6/2006 | Suda et al. ............ | 365/189.01 |
| 2003/0156473 A1 * | 8/2003 | Sinclair et al. ............. | 365/200 |
| 2004/0080998 A1 | 4/2004 | Chang et al. | |
| 2004/0202024 A1 * | 10/2004 | Shinagawa et al. .... | 365/185.29 |
| 2004/0233707 A1 | 11/2004 | Bell et al. | |
| 2006/0004969 A1 | 1/2006 | Suda | |

FOREIGN PATENT DOCUMENTS

JP   2003-280822   10/2003

OTHER PUBLICATIONS

U.S. Appl. No. 10/941,820, filed Sep. 16, 2004, Suda.

* cited by examiner

*Primary Examiner*—Anh Phung
*Assistant Examiner*—N Nguyen
(74) *Attorney, Agent, or Firm*—Oblon, Spivak, McClelland, Maier & Neustadt, P.C.

(57) ABSTRACT

A memory management device for managing a nonvolatile semiconductor memory which comprises a plurality of blocks, and permits data to be erased in units of one block, the memory management device comprises a setting unit configured to set an address range of data to be erased in response to an erase command in a block in which the data to be erased is written, when the erase command is issued with respect to the nonvolatile semiconductor memory and a controlling unit configured to output initial-value data as data to be read in response to a data read command, when the data read command is issued with respect to the nonvolatile semiconductor memory, and then when an address range of the data to be read in response to the data read command is included in the address range set by the setting unit.

11 Claims, 8 Drawing Sheets

MEMORY MANAGEMENT DEVICE AND MEMORY DEVICE

CROSS-REFERENCE TO RELATED APPLICATIONS

This application is a continuation of application Ser. No. 11/022,857, filed on Dec. 28, 2004, now U.S. Pat. No. 7,057,942 and is based upon and claims the benefit of priority from prior Japanese Patent Application No. 2004-265806, filed Sep. 13, 2004, the entire contents of each are incorporated herein by reference.

BACKGROUND OF THE INVENTION

1. Field of the Invention

The present invention relates to a memory management device including a nonvolatile memory and a memory device.

2. Description of the Related Art

In a conventional NAND flash memory, which is a type of nonvolatile memory, when part of the data in a physical block is overwritten, it is necessary to write the remaining data in the block to another block. This processing takes a long time.

To obviate such extra write processing, Jpn. Pat. Appln. KOKAI Publication No. 2003-280822, for example, discloses a method in which a number of physical blocks are related to one virtual block. In this method, the relation between the physical blocks and the virtual block is canceled in response to an erase command, shortening the time required for erasing data.

If a memory card (memory device) incorporating a conventional a NAND flash memory adopts a file allocation table (FAT) file system, which is recommended for an SD (trademark) memory card, and has a capacity of 1 GB or less, the size of each cluster in the memory card is 16 Kbytes. Because of this, the size of a file to be written to or read from the memory card is a multiple of 16 Kbytes. Thus, in many cases, a host device designates 16 Kbytes as the amount of data to be erased at one time, when issuing an erase command. It should be noted that, in most cases, erase commands are issued to the memory card when formatting the card. This involves the host device reading the master boot record, and progressively erasing data in units of 16 Kbytes by sequentially addressing the blocks to be erased.

Conventionally, the physical block size of many NAND flash memories is 16 Kbytes, which is equal to the above-mentioned cluster size. However, in recent years, NAND flash memories having, for instance, 32-, 128- and 256-Kbyte physical blocks, have appeared.

Where a NAND flash memory has 256-Kbyte physical blocks and 16-Kbyte clusters, in erasing 16 Kbytes of data from a physical block in the NAND flash memory, the other 240 Kbytes of data must be copied to another physical block. This is because the NAND flash memory cannot be over-written. Accordingly, when data in a NAND flash memory is partially erased, it takes a long time.

BRIEF SUMMARY OF THE INVENTION

According to an embodiment of the present invention, a memory management device for managing a nonvolatile semiconductor memory which comprises a plurality of blocks, and permits data to be erased in units of one block, the memory management device comprises a setting unit configured to set an address range of data to be erased in response to an erase command in a block in which the data to be erased is written, when the erase command is issued with respect to the nonvolatile semiconductor memory and a controlling unit configured to output initial-value data as data to be read in response to a data read command, when the data read command is issued with respect to the nonvolatile semiconductor memory, and then when an address range of the data to be read in response to the data read command is included in the address range set by the setting unit.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be explained with reference to the accompanying drawings.

Figure 1:
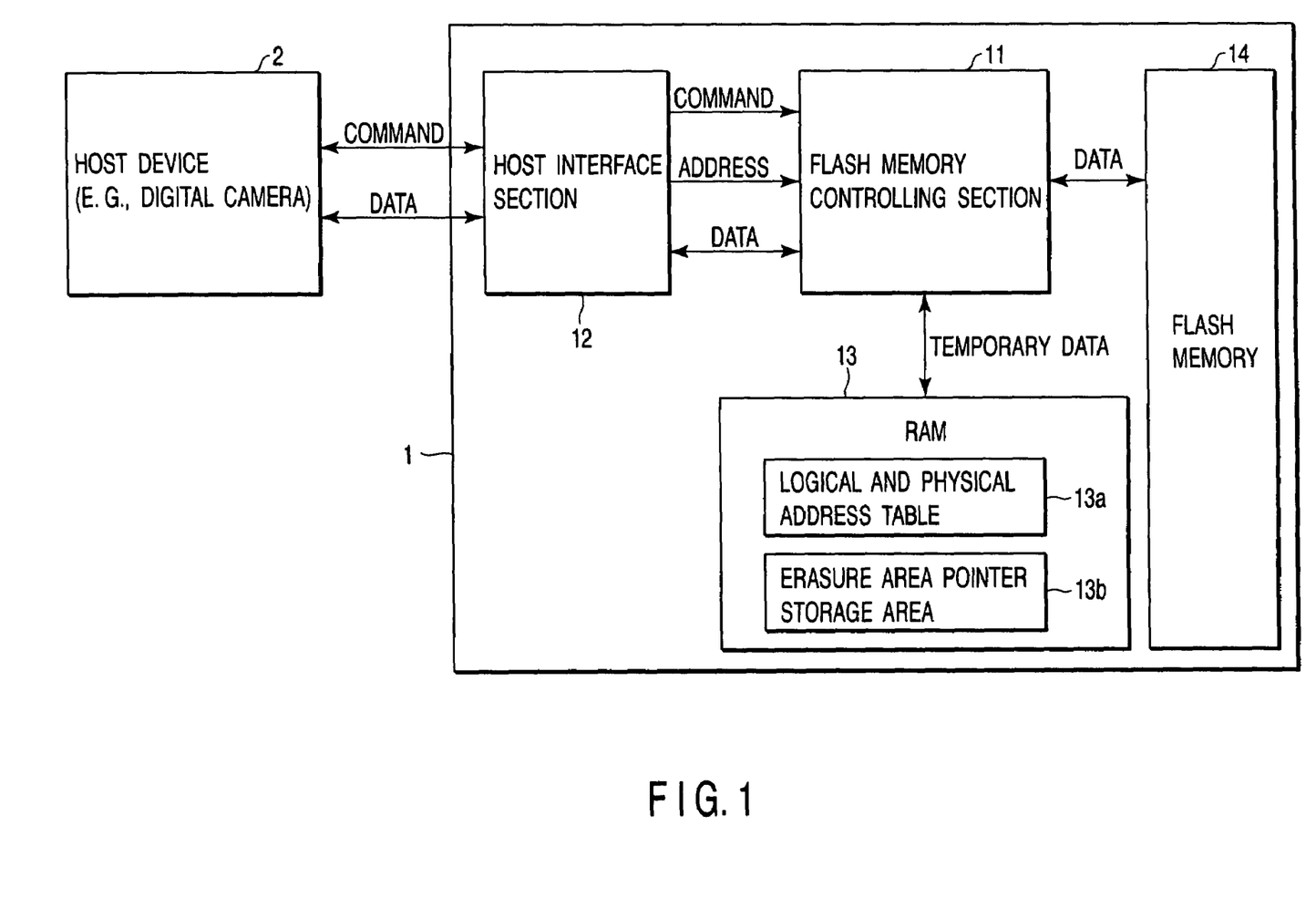
FIG. 1 is a block diagram of an example of the structure of a memory card (memory device) 1 according to the embodiment of the present invention.

FIG. 1 is a block diagram of an example of the structure of a memory card (memory device) 1 according to the embodiment of the present invention.

As shown in FIG. 1, the memory card 1 is connected to a host device 2 such as a digital camera.

The memory card 1 comprises a flash memory controlling section 11, a host interface section 12, a RAM 13 and a flash memory 14. The flash memory 14 is provided as, e.g., a NAND type nonvolatile memory. The flash memory controlling section 11 is connected to the host device 2 by the host interface section 12. Also, the flash memory controlling section 11 is connected to a RAM 13 and the flash memory 14.

A command issued from the host device 2 to the memory card 1 is input to the host interface section 12 in the memory card 1 through a signal line for command.

The host interface section 12 extracts command information and address information from the command issued from the host device 2 based on the format of the command. The flash memory controlling section 11 operates based on the command information and address information from the host interface section 12.

The flash memory controlling section 11 manages data erasure and a table indicating a relationship between logical blocks and physical blocks of the flash memory 14.

Figure 2:
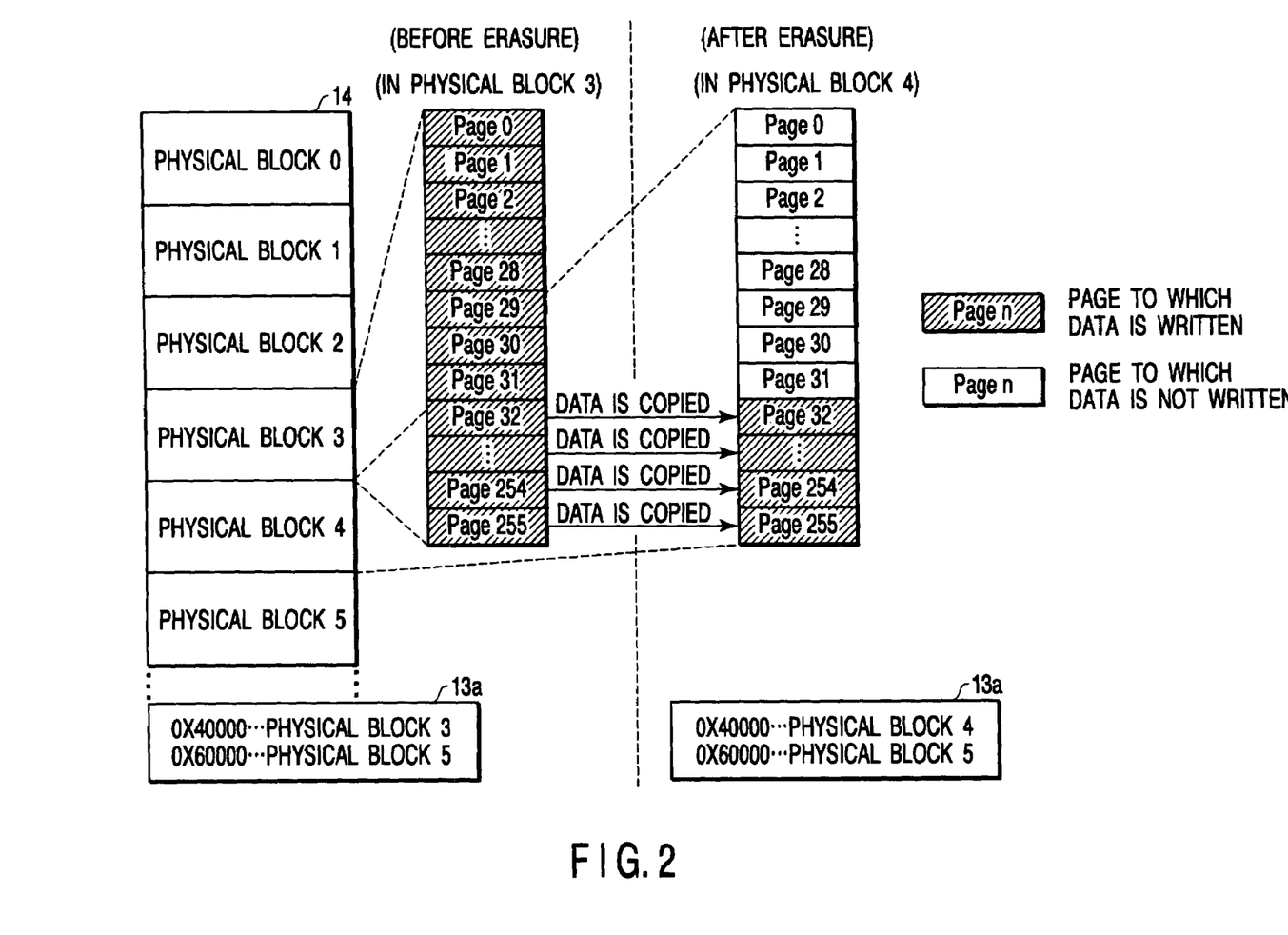
FIG. 2 is a view showing the first example of a procedure for erasing part of data written to a physical block on the flash memory 14 of the memory card 1 according to the embodiment of the present invention.

FIG. 2 is a view showing the first example of a procedure for erasing part of data written to a physical block on the flash memory 14 of the memory card 1 according to the embodiment of the present invention.

Each of the physical blocks of the flash memory 14 has a size of 128 Kbytes (KB), and consists of 256 pages. In each physical block, each of the 256 pages permits 512 bytes of data items to be written to each page.

To be more specific, FIG. 2 shows the case where successive 256-Kbytes data items are written to two physical blocks in the memory card 1. The logical block addresses are index values of a virtual memory. The first two figures "0x" of each of the logical addresses are an identifier of a hexadecimal number.

Since the size of one physical block in the flash memory 14 is 128 Kbytes, as stated above, the above successive 256-Kbytes data items are written to two physical blocks.

Referring to FIG. 2, a physical block "n" (n=0, 1, or 2, . . . ) is a physical block having a physical block address "n" assigned thereto. In an example shown in FIG. 2, of the above 256 Kbytes of data items, 128 Kbytes of data items are written a physical block 3 having physical block address "3" given thereto. The other 128 Kbytes of data items are written to a physical block 5 having physical block address "5" given thereto.

The RAM 13, as shown in FIG. 1, includes a logical and physical address table 13a and an erasure area pointer storage area 13b. The logical and physical address table 13a manages logical addresses and physical addresses allocated to physical blocks in which data items are written, of the physical blocks in the flash memory 14, in association with each other.

For example, "0x40000 . . . physical block 3" written to the logical and physical address table 13a indicates that logical block address "0x40000" and physical block address "3" are related to each other. To be more specific, it means that data items stored in a logical block including an address range in which 0x20000 addresses are successive from address "0x40000" are stored in a physical block having physical block address "3" assigned thereto.

Furthermore, a physical block the physical block address of which is not related to a logical block address is an unused physical block. In the unused physical block, initial-value data is written. To be more specific, when a system of the flash memory 14 issues a command to read the unused block, i.e., the flash memory controlling section 11 issues the command, the initial-value data is read from the unused block.

The unused physical block can be used when its physical block address is related to a logical block address in accordance with the control of the flash memory controlling section 11.

With respect to a physical block having a physical block address given thereto, the erasure area pointer storage area 13b of the RAM 13 (see FIG. 1) manages a page or pages of the pages of the physical block, to which user data is not written, i.e., initial-value data is written. The user data is data other than the initial-value data.

When a command to read a physical block the logical block address of which is "0x40000" is given from the host device 2 to the flash memory controlling section 11 through the host interface section 12, the flash memory controlling section 11 refers to the logical and physical address table 13a. Then, the flash memory controlling section 11 detects from the logical and physical address table 13a that a data item is written to a physical block given physical block address "3" related to logical block address "0x40000", and outputs the data item written to the physical block to the host device 2 as data to be read.

Next, the first example of the procedure will be explained by referring to the procedure of processing performed in the following case: when the host device 2 issues an erase command to erase 16384-byte data items (32 pages) of the data items stored in the physical block having physical address "3", which is managed by the logical and physical address table 13a when physical address "3" is related to the logical block address "0x40000", the processing is performed in response to the erase command. In the following explanation, suppose the RAM 13 does not include the erasure area pointer storage area 13b.

Also, the following explanation will be given with respect to the case where data items of 32 pages from "Page 0" to "Page 31" of the physical block having physical block address "3" are erased.

When the data items of the pages "Page 0" to "Page 31" are erased, data items written to the pages following "Page 32" in the physical block having physical block address "3" are also erased along with the data items of the pages "Page 0" to "Page 31". This is because data erasure is carried out in units of one physical block.

Therefore, the data items written to the pages following "Page 31" in the physical block having physical block address "3" are copied to another physical block. In this case, they are copied to a physical block (physical block 4) given physical block address "4". When this copying is completed, the flash memory controlling section 11 performs rewriting processing to change information "0x40000 . . . physical block 3" stored in the logical and physical address table 13a to "0x40000 . . . physical block 4". Thereby, in the logical and physical address table 13a, the physical block address related to logical block address "0x40000" is changed from "3" to "4".

When a command to access to the flash memory 14 is issued from the host device 2, the flash memory controlling section 11 refers to the logical and physical address table 13a in which the information is rewritten as described above. As a result, the flash memory controlling section 11 determines that 128 Kbytes of data items written to blocks of a virtual memory, to which logical block addresses "0x40000" to "0x20000" are assigned, are written to a physical block having physical block address "4" assigned thereto.

For the above reason, when 16 Kbytes of data items, i.e., the data items written to 32 pages, are erased from 256 pages of a physical block having a size of 128 Kbytes, the flash memory controlling section 11 reads the data items of 224 pages (=256 pages−32 pages) of the physical block, and must perform a control such that the read data items are written to another physical block. Thus, the time required for data erasure is long.

For example, the time for performing writing processing on a physical block in the flash memory 14 is 1.2 miliseconds/4 pages, and that for performing writing processing on 0224 pages is 67.2 miliseconds (=224/4*1.2). The time for erasing the data items of one physical block is 2 miliseconds. The time for erasing the data items of 32 pages is approximately 32 times longer than that for erasing the data pieces of one physical block.

In view of the above, to shorten the time period for the above processing, a memory management device according to the above embodiment of the present invention is provided to have a function of setting an erasure area pointer or erasure area pointers.

The erasure area pointer or pointers are information stored in the erasure area pointer storage area 13b shown in FIG. 1. It also indicates the range of page addresses assigned to successive pages, of the pages addresses assigned to the pages of a physical block in the flash memory 14.

With respect to the above physical block, the flash memory controlling section 11 determines the pages in the address range indicated by the erasure area pointer or pointers stored in the erasure area pointer storage area 13b are in a virtual erased state. The virtual erased state is a state in which the flash memory controlling section 11 does not actually erase data items to be erased, i.e., they are subjected to virtual erasure, in response to an access command from the host device 2.

The value indicated by the erasure area pointer or pointers is a value from which virtual erased part of each physical block in the flash memory 14 can be determined by estimation. For example, the above value is an address value indicating the end point of the virtual erased part, or the size of the part which is determined with respect to the first address, or a first address value of an area in which data is effective.

Figure 3:
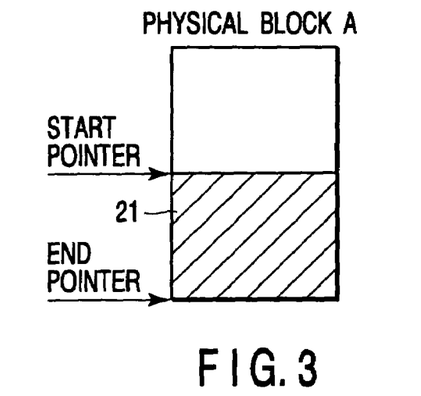
FIG. 3 shows the first example of the erasure area pointers.

FIG. 3 shows the first example of the erasure area pointers. In the first example, a start pointer and an end pointer are set as the erasure area pointers. The flash memory controlling section 11 designates as a start pointer a page address given to the first one of pages to which data items to be erased are written to a physical block (physical block A) in which data items to be erased are written in response to an erase command from the host device 2. Then, the flash memory controlling section 11 designates as an end pointer a page address given to the last one of the pages to which the data items to be erased are written.

Consequently, with respect to the physical block in which the data items to be erased are written, the area of pages corresponding to an address range from the page address designated as the start pointer to that designated as the end pointer, i.e., an area indicated by reference numeral 21 (as shown in FIG. 3), is the virtual erased part, which will be referred to as a virtual erasure area.

Figure 4:
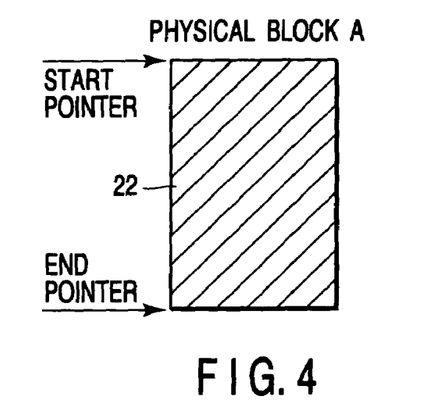
FIG. 4 shows the second example of the erasure area pointers.

FIG. 4 shows the second example of the erasure area pointers. In the second example, the flash memory controlling section 11 sets the start and end pointers as the erasure area pointers as in the first example. However, in the second example, an address given to the first page of the physical block in which the data items to be erased are written is the start pointer, and an address given to the last page of the physical block is the end pointer.

In the second example, the flash memory controlling section 11 does not need to perform processing for storing the erasure area pointers in the erasure area pointer storage area 13b. That is, it has only to perform processing for canceling the relation between the logical block addresses and the physical addresses ("A"), which is indicated by the logical and physical address table 13a, in order that a physical block (area 22) to be erased be set in an unused state.

Figure 5:
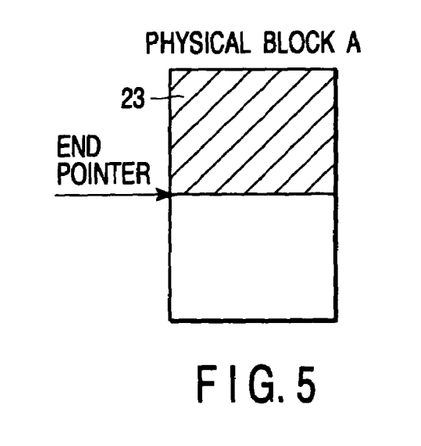
FIG. 5 shows the third example of the erasure area pointer.

FIG. 5 shows the third example of the erasure area pointer. In the third example, the flash memory controlling section 11 defines the page address corresponding to the start of the virtual erasure area as a page address given to the first page of the physical block, and sets only the end pointer as the erasure area pointer. Thus, in the flash memory 14, the area of pages corresponding to an address range from a page address given to the first page of the physical block in which the data items to be erased are written to a page address designated by the end pointer, i.e., an area indicated by reference numeral 23, is a virtual erasure area.

Figure 6:
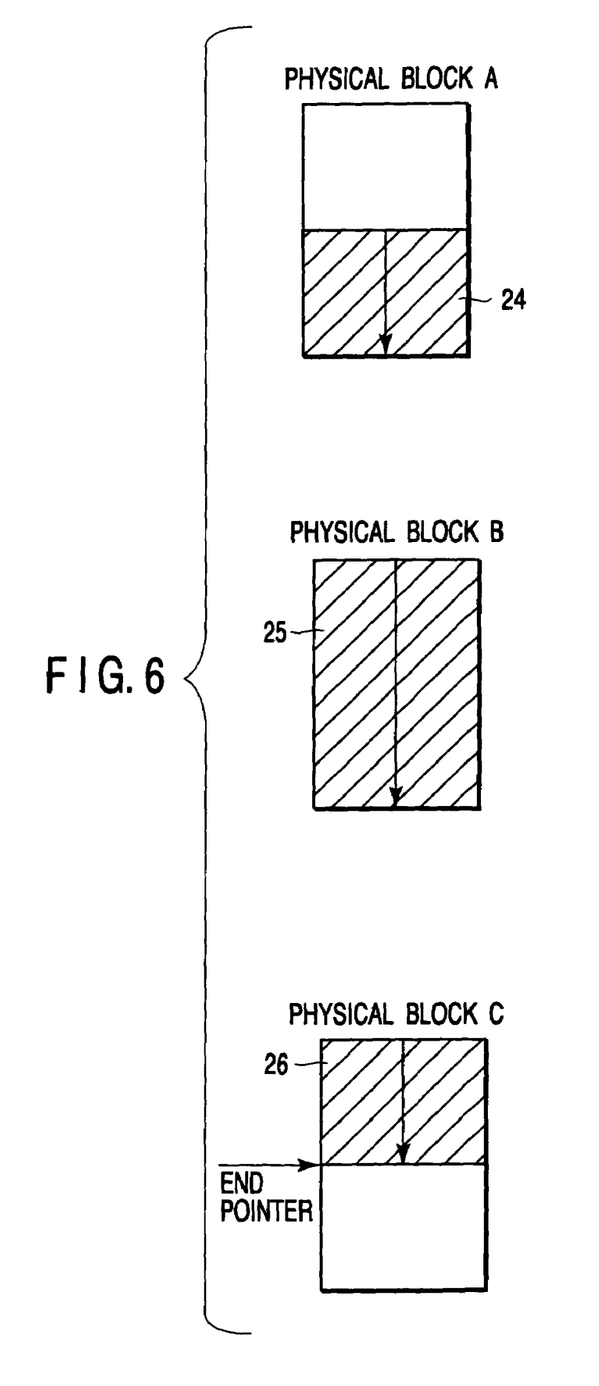
FIG. 6 shows the fourth example of the erasure area pointer.

FIG. 6 shows the fourth example of the erasure area pointer. In the fourth example, only the end pointer is set as the erasure area pointer as in the example shown in FIG. 3. The following is an explanation of processing in the case where an erase command to erase data items written to a number of physical blocks in the flash memory 14 is issued from the host device 2.

To be more specific, the processing will be explained by referring to the case where an erase command to erase data items written to three physical blocks (physical blocks A, B and C) is issued from the host device 2. The last page of the physical block A is not the end portion of the virtual erasure area, and thus the end pointer of the virtual erasure area cannot be set at the last page of the physical block A. Therefore, the flash memory controlling section 11 performs such data erasing and copying processing as shown in FIG. 2 on an area 24 of the physical block A, the data items of which are to be erased.

With respect to the physical block B, the data items written to the entire area of the physical block B are to be erased. Thus, the flash memory controlling section 11, as stated above, erases address information of the physical block B and a logical block address related to the address information of the physical block B from the logical and physical address table 13a, thereby setting the entire area (area 25) of the physical block B in an unused state.

Furthermore, with respect to the physical block C, the flash memory controlling section 11 sets a page address given to the last page of the area in which data items to be erased are written, as the end pointer of the erasure area pointer, as in the example shown in FIG. 5. Thereby, an area 26 is set as a virtual erasure area. Thus, of the data items written to the physical block C, data items not to be erased do not need to be transferred.

For example, when the flash memory controlling section 11 designates "Page10" as the erasure area pointer, data items written to an area from the first page of the physical block C to page 10 become in a virtual erased state. Also, when the flash memory controlling section 11 designates "Page0" as the erasure area pointer, all the data items written to all the pages of the physical block C (from the first page to the last page) are effective. This means that the physical block C does not include an area to be subjected to virtual erasure.

The erasure area pointer storage area 13b stores the data items of a physical block in which data items to be erased in response to an erase command from the host device 2 are stored. However, in the case where a large number of storage areas can be provided in the RAM 13, the erasure area pointer storage area 13b may be set to manage the data items of virtual erasure areas with respect to a number of physical blocks, separately.

Next, the second example of the procedure for erasing part of data written to a physical block on the flash memory 14 of the memory card 1 according to the embodiment of the present invention will be explained.

Figure 7:
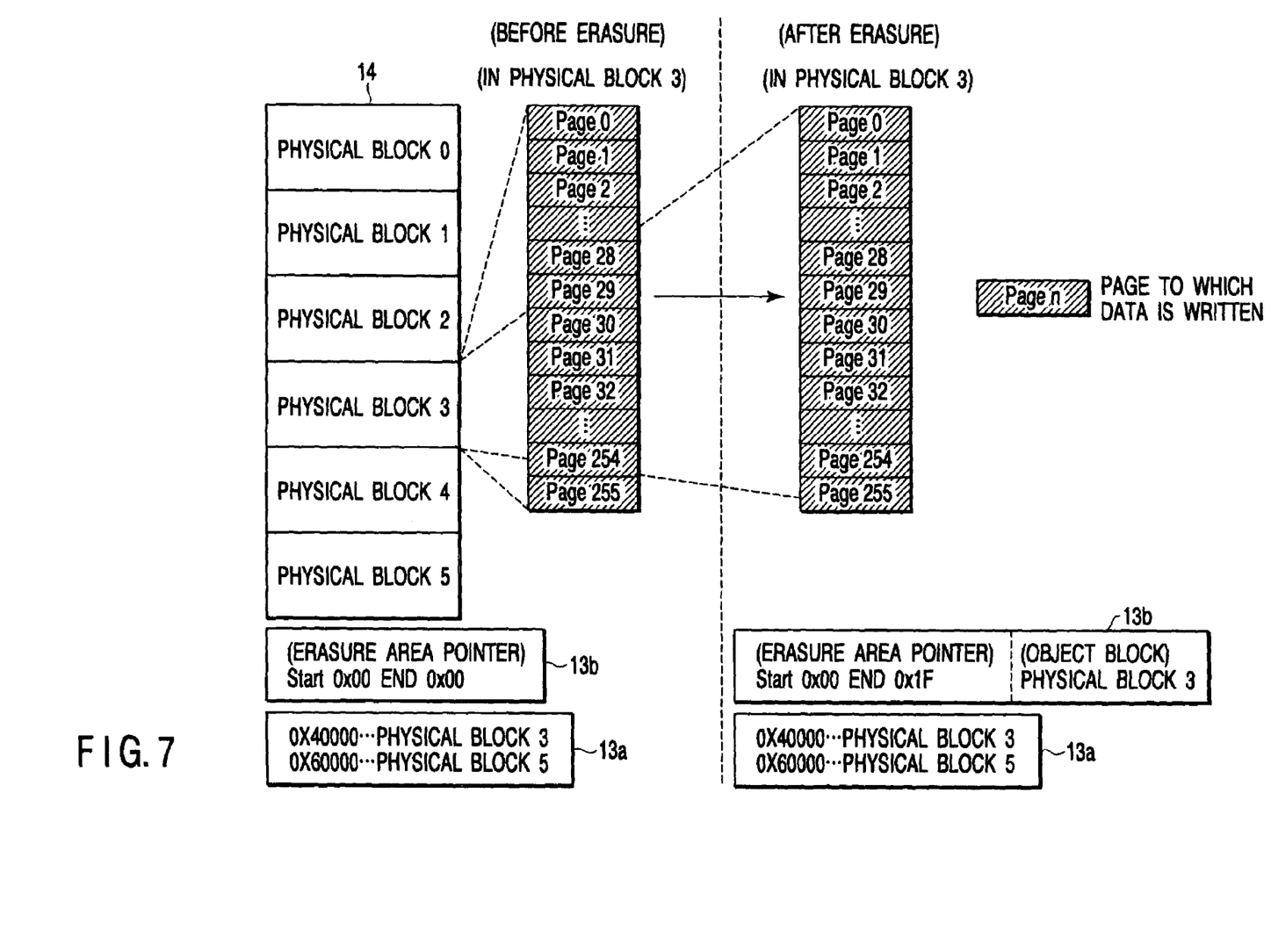
FIG. 7 is a view showing the second example of the procedure for erasing data written to the memory card 1 according to the embodiment of the present invention.
Figure 8:
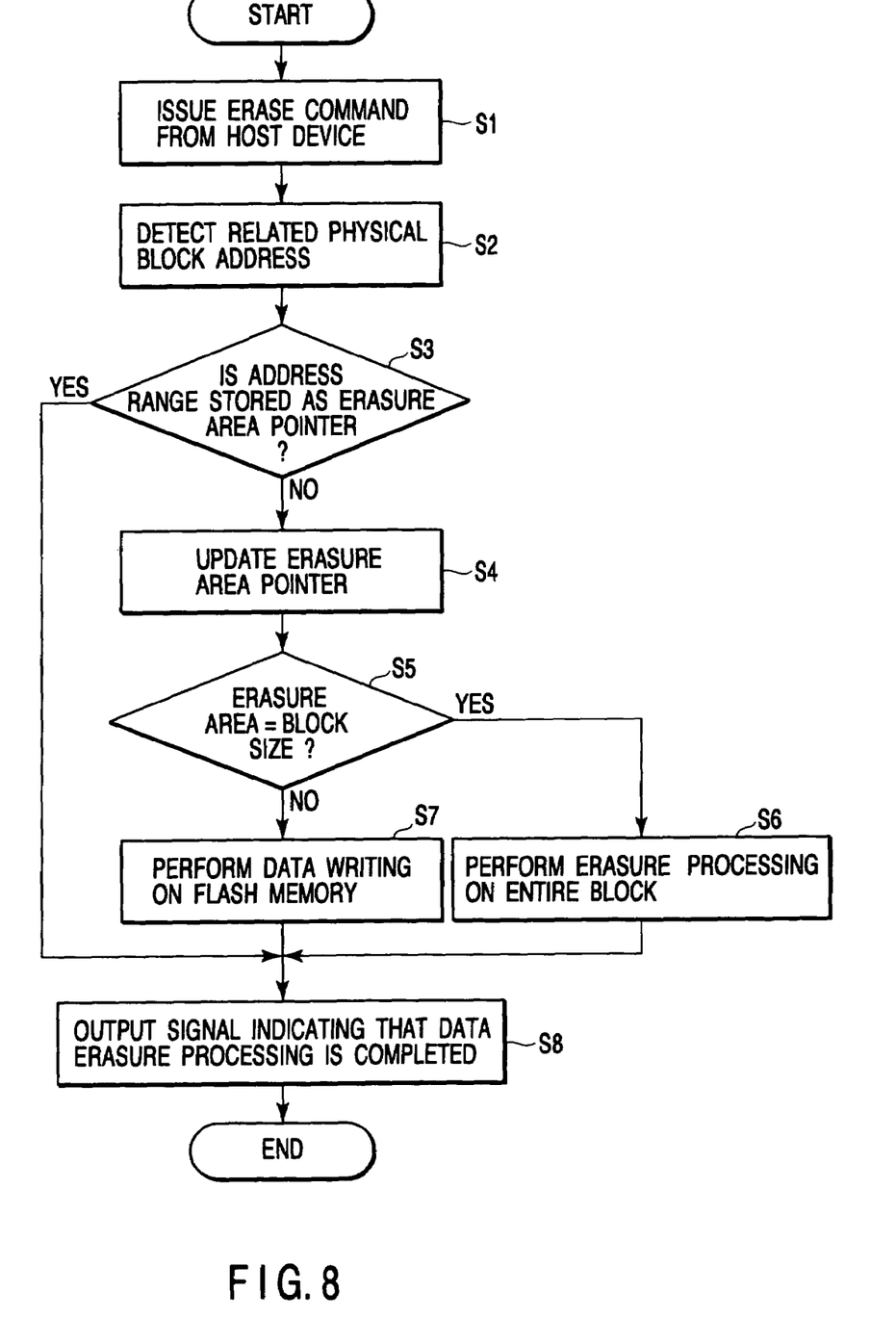
FIG. 8 is a flowchart of the second example of the procedure for erasing data written to the memory card 1 according to the embodiment of the present invention.

FIG. 7 is a view showing the second example of the procedure for erasing data written to the memory card 1 according to the embodiment of the present invention. FIG. 8 is a flowchart of the second example of the procedure for erasing data written to the memory card 1 according to the embodiment of the present invention.

Next, the first example of the procedure will be explained by referring to the procedure of processing performed in the following case: when the host device 2 issues an erase command to erase 16384-bytes data items (32 pages) of the data items which are managed when they are stored in a physical block given physical block address "3" which is related to logical block address "0x40000" by the logical and physical address table 13a, the processing is performed in response to the erase command, as in the first example of the procedure. The following explanation will be given with respect to the case where the RAM 13 includes the erasure area pointer storage area 13b. Furthermore, the structures of physical blocks not yet subjected to data erasure and the contents of information to be managed by the logical and physical address table 13a are the same as those in the first example. "Start 0x00 END 0x00" stored in the erasure area pointer storage area 13b indicates that page address "Page0" is set as the start address and end address of the erasure area pointer, and the virtual erasure area is not set.

When an erase command is issued from the host device 2 (step S1), the flash memory controlling section 11 refers to the logical and physical address table 13a, and detects the physical address of a physical block related to a logical block given an address designed in the erasure command (step S2). In the example shown in FIG. 7, the flash memory controlling section 11 detects information indicating that logical block address "0x40000" is related to physical block address "3".

Then, the flash memory controlling section 11 determines whether an address range corresponding to an area in which the data items to be erased in response to the erase command are stored is already stored in the erasure area pointer storage area 13b (step S3).

When it is determined in step S3 that the above address range is not stored in the erasure area pointer storage area 13b, the flash memory controlling section 11 performs rewriting processing to change data written to the erasure area pointer storage area 13b to "Start 0x00 END 0x1F" in order that the area in which the data items to be erased in response to the erase command are stored, i.e., the area of 32 pages from page 0 to page 32 of a physical block given physical block address "3", be set as the virtual erasure area, and also writes "physical block 3" as data indicating an object block (step S4). The object block is a physical block including a page to which data items to be subjected to virtual erasure are written.

Then, the flash memory controlling section 11 determines whether or not the address range indicated by the erasure area pointer designated in step S4 is coincident with the size of a physical block to be subjected to data erasure, i.e., whether or not a start address indicated by the erasure area pointer is a first page address of the physical block to be subjected to data erasure, and an end address indicated by the erasure area pointer is a last page address of the physical block to be subjected to data erasure (step S5).

When the flash memory controlling section 11 determines in step S5 that the above address range is coincident with the size of the physical block subjected to data erasure, it erases a physical block address given to the above physical block and data indicating a logical block address related to the physical block address (step S6).

On the other hand, when the flash memory controlling section 11 determines in step S5 that the above address range is not coincident with the size of the physical block to be subjected to data erasure, it writes, in the flash memory 14 also, the data items written to the erasure area pointer storage area 13b in step S4 (step S7). When the step S7 is carried out, even if a power supply to the memory card 1 is turned off, the information of the erasure area pointer is maintained, and thus a virtual erased state is also maintained.

Furthermore, when the power supply to the memory card 1 is turned off, and is then turned on, the flash memory controlling section 11 has only to read information which is stored in the flash memory 14 in step S7, and write the information in the erasure area pointer storage area 13b.

After the step S6 or S7 are carried out, the flash memory controlling section 11 outputs a control signal indicating that data erasure processing is completed, to the host device 2 through the host interface section 12 (step S8).

Figure 9:
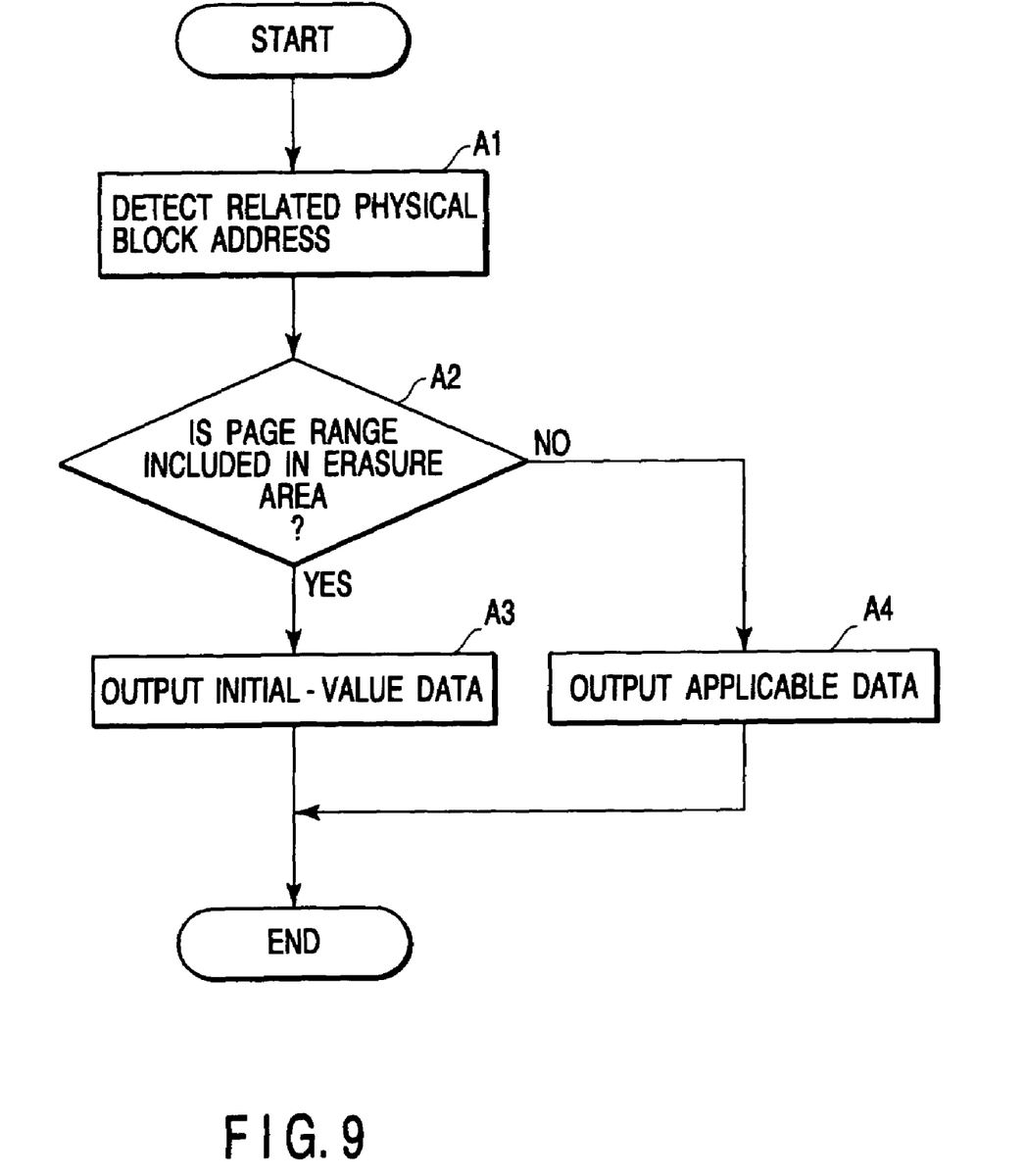
FIG. 9 is a flowchart of an example of the procedure for reading data written to the memory card 1 according to the embodiment of the present invention.

FIG. 9 is a flowchart of an example of the procedure for reading data written to the memory card 1 according to the embodiment of the present invention.

In the case where a data read command is issued from the host device 2 after the data erasure processing performed as indicated by the flowchart shown in FIG. 8, the flash memory controlling section 11 refers to the logical and physical address table 13a, and detects a physical block address related to a logical block address designated in the data read command (step A1).

Then, the flash memory controlling section 11 refers to the erasure area pointer storage area 13b, and determines whether a page range in which data items to be read are written is included in the area indicated by the erasure area pointer (step A2).

When the flash memory controlling section 11 determines in step A2 that the page range is included in the above area, it outputs an initial-value data as data to be read, to the host device 2 (step A3). On the other hand, when it determines in step A2 that the page range is not included in the area, it outputs applicable data to be read to the host device 2 (step A4).

In such a manner, when the processing is performed in accordance with the procedure explained as the second example, it is not necessary to transfer data as in the first example of the procedure, and the time for erasing data can be greatly shortened.

Next, the third example of the procedure for erasing part of the data written to a physical block in the flash memory 14 of the memory card 1 according to the embodiment of the present invention will be explained.

Figure 10:
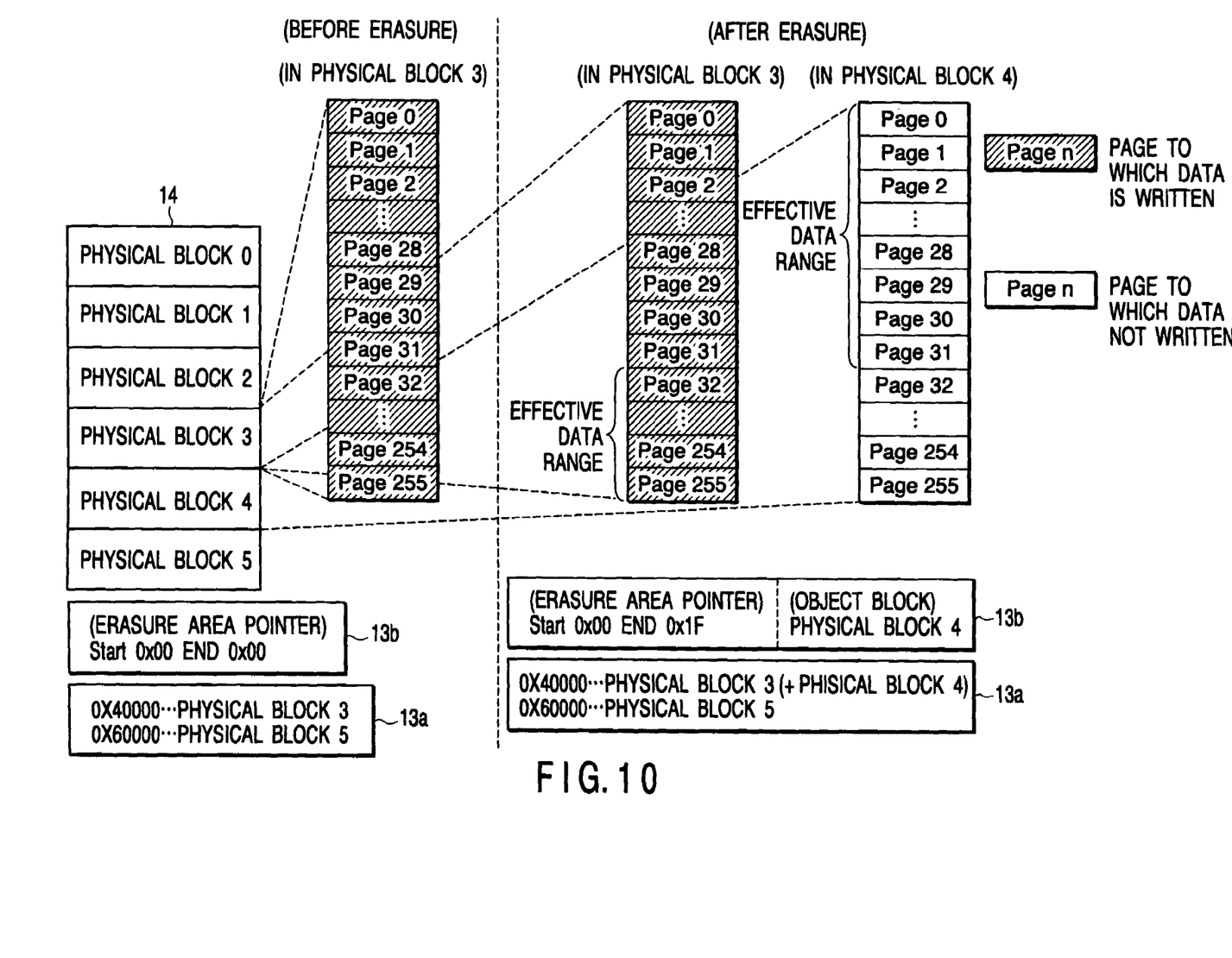
FIG. 10 is a view showing the third example of the procedure for erasing data written to the memory card 1 according to the embodiment of the present invention.

FIG. 10 is a view showing the third example of the procedure for erasing data written to the memory card 1 according to the embodiment of the present invention.

The third example of the procedure will be explained by referring to the procedure of processing performed in the following case: when the host device 2 issues an erase command to erase 16384-byte data items (32 pages) of the data items stored in a physical block given a physical address "3" related to the logical block address "0x40000" by the logical-to-physical conversion table 13a, as in the first example (in FIG. 2), the processing is performed in response to the erase command. Furthermore, the structures of physical blocks not yet subjected to data erasure and the contents of information to be managed by the logical and physical address table 13*a* are the same as those in the second example (in FIG. 7).

When an erase command is issued from the host device 2, the flash memory controlling section 11 refers to the logical-to-physical conversion table 13*a*, and detects physical block address "3" related to the logical block address "0x40000" designated in the erase command.

Then, if an address range corresponding to an area in which the data items to be erased in response to the erase command are stored is not stored as data in the erasure area pointer storage area 13*b*, the flash memory controlling section 11 performs rewriting processing to change information "0x40000 . . . physical block 3" stored in the logical and physical address table 13*a* in the RAM 13 to "0x40000 . . . physical block 3 (+physical block 4)", in order that the area in which the data items to be erased in response to the erase command are stored, i.e., the area of 32 pages from page 0 to page 31 of a physical block given physical block address "3" , be set as the virtual erasure area. Furthermore, initial-value data is written to a physical block given physical block address "4" , i.e., this physical block is unused.

The flash memory controlling section 11 performs rewriting processing to change information written to the erasure area pointer storage area 13*b* to "Start 0x00 END 0x1F", and writes "physical block 4" as data indicating an object block in the erasure area pointer storage area 13*b* (see FIG. 10).

Thereby, the physical block address related to logical block address "0x40000" is changed to two physical block addresses "3" and "4" , and an area corresponding to the range of pages from "Page 0" to "Page 31" indicated by the physical area pointer stored in the erasure area pointer area 13*b*, of the pages of an object physical block given a physical block address (i.e., physical block address "4") stored in the erasure area pointer storage area 13*b*, which is one of the above two physical block addresses "3" and "4" stored in logical and physical address table 13*a*, is the first area in which data items to be read in response to the data read command from the host device 2 after data erasure processing.

Furthermore, of physical blocks given physical block addresses "3" and "4" stored in the logical and physical address table 13*a* , a physical block (given physical block address "3") other than the above object physical block given the physical block address stored in the erasure area pointer storage area 13*b* is handled as follows: an area corresponding to the page range other than the above page range indicated by the physical area pointer stored in the erasure area pointer area 13*b* is the second area in which data items to be read in response to the data read command from the host device 2 after the data erasure processing are written. That is, the second area is an area corresponding to the page range other than the range of pages "Page0" to "Page31" of the pages of the physical block given physical block address "3" which is one of the physical block addresses ("3" and "4") stored in the logical and physical address table 13*a*, i.e., it is the area corresponding to the range of pages "Page32" to "Page255".

When a data read command is issued from the host device 2, the flash memory controlling section 11 refers to the logical and physical address table 13*a*, and detects a physical block address related to a logical block address designated by the data read command.

Then, when the flash memory controlling section 11 refers to the erasure area pointer storage area 13*b*, and a page to which data items to be erased are written is included in an area indicated by the erasure area pointer or pointers, the flash memory controlling section 11 outputs an initial-value data to the host device 2.

When such a processing is performed, it is not necessary to transfer data as in the first example of the procedure, and the time for erasing data can be greatly shortened. In this regard, the third example of the procedure is the same as the second example of the procedure.

In the memory card 1 according to the embodiment of the present invention, the above erasure area pointer or pointers are used when data erasure processing is performed in accordance with an instruction from the host device 2. The case where the erasure processing is performed is not limited to the case where an instruction for formatting the data stored in the flash memory 14 is given from the host device 2, i.e., there is a case where the erasure processing is performed when an instruction for copying the data stored in the flash memory 14 is given from the host device 2. In such a case, when the above erasure area pointer or pointers are applied to erasure processing accompanied with writing processing, the time for the writing processing is longer than that in ordinary writing processing.

Figure 11:
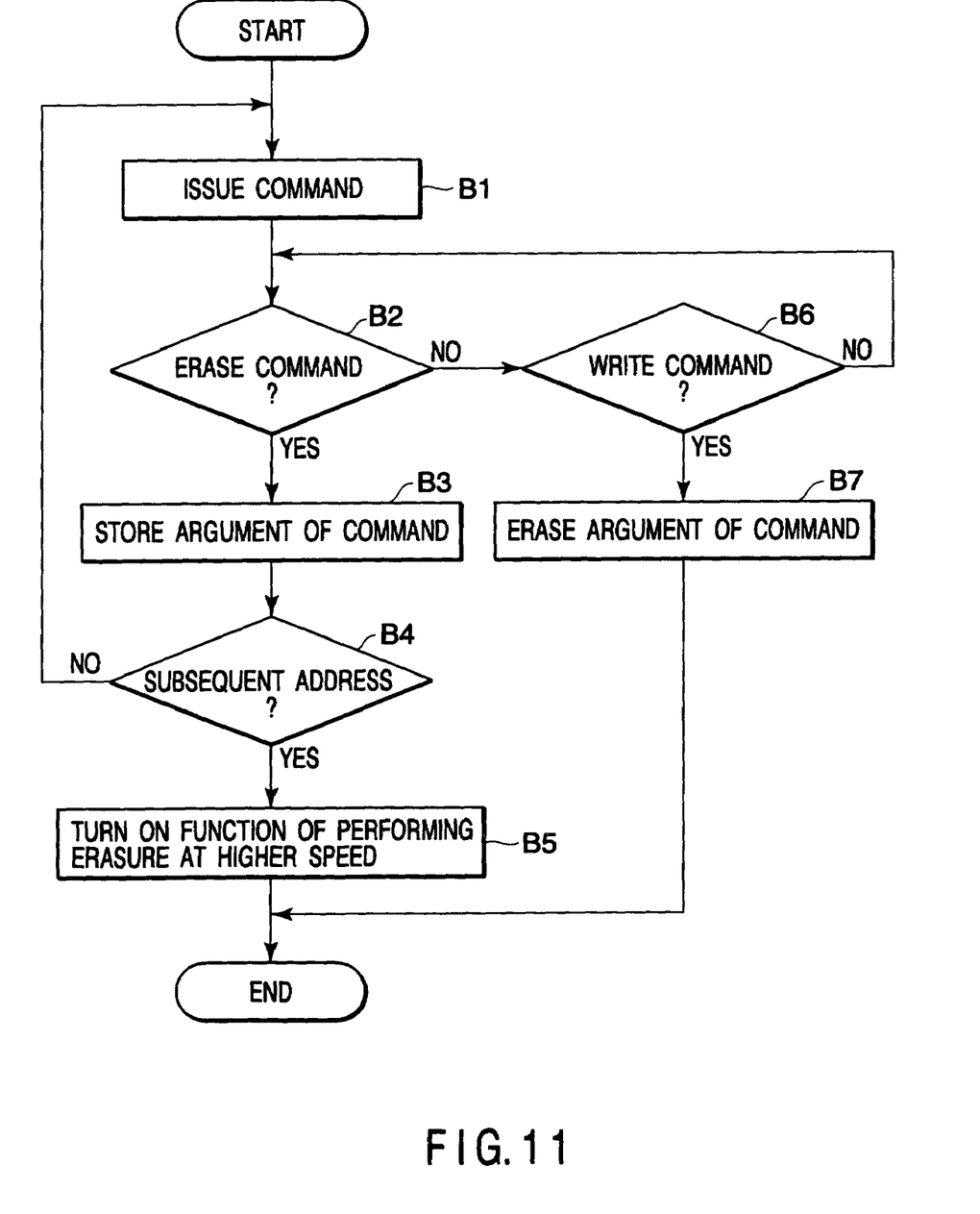
FIG. 11 is a flowchart showing an example of processing for determining whether or not an erasure area pointer or pointers are applied to erasure of data written to the memory card according to the embodiment of the present invention.

However, a procedure shown in FIG. 11 prevents an increase in the writing processing, and takes advantage of shortening of the time for data erasure due to the erasure area pointer or pointers. The procedure will be explained with reference to FIG. 11. FIG. 11 is a flowchart showing an example of processing for determining whether or not an erasure area pointer or pointers are applied to erasure of data written to the memory card 1 according to the embodiment of the present invention.

The procedure pays attention to a feature in which data erase commands are successively issued when an instruction for formatting the data stored in the flash memory 14 is given from the host device 2, and the addresses of pages to be subjected to data erasure, which are indicated by the arguments of the erasure commands, are successive. In the procedure, switching between the use and nonuse of the erasure area pointer or pointers in the data erasure processing is effected in accordance with whether or not the above feature is satisfied as condition.

When a command issued from the host device 2 is a command for an giving an instruction for formatting the data stored in the flash memory 14, data is erased in units of 16 Kbytes, i.e., data erasure is repeated in units of 16 Kbytes, and the areas subjected to data erasure are successive.

To be more specific, when the flash memory controlling section 11 of the memory card 1 recognizes a command issued from the host device 2 (step B1), it determines whether the command is an erase command or not (step B2).

Then, when the flash memory controlling section 11 determines that the command is an erase command, it stores the argument of the erasure command in the RAM 13 (step B3).

Furthermore, the flash memory controlling section 11 determines whether or not an argument subsequent to the argument stored in the RAM 13 in the step B3 is already stored in the RAM 13 (step B4). Then, when it determines in step B4 that the above argument is not stored in the RAM 13, the step is returned to step B1.

On the other hand, when the flash memory controlling section 11 determines in step B4 that the argument is already stored in the RAM 13, it means that data erase commands the arguments of which are successive are issued successively. Thus, in this case, the flash memory controlling section 11 determines that an instruction for formatting of data is given by the host device 2, and data erasure processing is carried out by using the above erasure area pointer or pointers (step B5).

In step B2, when the flash memory controlling section 11 determines whether the command is not an erase command, it determines whether the command recognized in step B1 is a write command (step B6). Then, when it determines that the recognized command is a write command, it erases an argument stored in the RAM 13, if the argument is stored therein (step B7).

In the above processing, the data erasure processing is carried out by using the erasure area pointer or pointers only when a command indicating the data format of the flash memory 14 is issued. Accordingly, the time for the writing processing is not increased, and that for data erasure can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system to be used by a host device, comprising:
   a host interface configured to receive a command from the host device;
   a nonvolatile semiconductor memory including a plurality of blocks, and configured to permit data to be erased in units of one block;
   a setting unit configured to set an address range of data to be erased without an erase operation when the host interface has received an erase command which requests erasing part of data stored in one block; and
   a controlling unit configured to output initial-value data as data to be read when the host interface has received a read command which requests reading data whose an address range is included in the address range set by the setting unit.

2. The memory system according to claim 1, wherein the setting unit configured to set an address range of data to be erased in response to an erase command, in units of one block.

3. The memory system according to claim 1, which further comprises a unit configured to store, in the nonvolatile semiconductor memory, information regarding the address range set by the setting unit.

4. The memory system according to claim 3, which further comprises a unit configured to read the information regarding the address range which is stored in the nonvolatile semiconductor memory, when power is supplied.

5. The memory system according to claim 1, wherein when data erase commands are issued with respect to blocks address ranges of which are successive, the setting unit configured to set the address range of the data to be erased in the block in which the data to be erased is written.

6. The memory system according to claim 1, wherein the nonvolatile semiconductor memory is a NAND nonvolatile semiconductor memory.

7. The memory system to be used by a host device, comprising:
   a host interface configured to receive a command from the host device;
   a nonvolatile semiconductor memory including a plurality of blocks, and configured to permit data to be erased in units of one block;
   a determining unit configured to determine whether an address range of data to be erased includes one or more blocks when the host interface has received an erase command which requests erasing data; and
   a managing unit configured to manage the plurality of the blocks while relating physical addresses and logical addresses of the plurality of the blocks to each other, the managing unit configured to cancel a relation between physical addresses and logical addresses with respect to the blocks included in the address range of data to be erased.

8. The memory system according to claim 7, wherein the setting unit configured to set an address range of data to be erased in response to an erase command, in units of one block.

9. The memory system according to claim 7, which further comprises a unit configured to store, in the nonvolatile semiconductor memory, information regarding the address range set by the setting unit.

10. The memory system according to claim 9, which further comprises a unit configured to read the information regarding the address range which is stored in the nonvolatile semiconductor memory, when power is supplied.

11. The memory system according to claim 7, wherein the nonvolatile semiconductor memory is a NAND nonvolatile semiconductor memory.

* * * * *